United States Patent
Kim et al.

(10) Patent No.: US 10,488,957 B2
(45) Date of Patent: Nov. 26, 2019

(54) FLEXIBLE DISPLAY APPARATUS HAVING A ROTATION GUIDE

(71) Applicant: SAMSUNG DISPLAY CO., LTD., Yongin-si, Gyeonggi-do (KR)

(72) Inventors: MuGyeom Kim, Yongin-si (KR); Jae-Won Lee, Yongin-si (KR); Myounjin Lee, Yongin-si (KR); Kyungwoo Han, Yongin-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 15/830,784

(22) Filed: Dec. 4, 2017

(65) Prior Publication Data

US 2018/0088695 A1 Mar. 29, 2018

Related U.S. Application Data

(63) Continuation of application No. 14/811,980, filed on Jul. 29, 2015, now Pat. No. 9,836,148.

(30) Foreign Application Priority Data

Jan. 13, 2015 (KR) ........................ 10-2015-0006145

(51) Int. Cl.
*G06F 3/041* (2006.01)
*G06F 1/16* (2006.01)
*H05K 1/02* (2006.01)
*H05K 1/18* (2006.01)
*G06F 3/044* (2006.01)

(52) U.S. Cl.
CPC ............ *G06F 3/041* (2013.01); *G06F 1/1643* (2013.01); *G06F 1/1652* (2013.01); *G06F 3/044* (2013.01); *G06F 3/0414* (2013.01); *H05K 1/028* (2013.01); *H05K 1/181* (2013.01); *G06F 2203/04102* (2013.01); *H05K 2201/10128* (2013.01); *H05K 2201/10151* (2013.01)

(58) Field of Classification Search
CPC ....................................................... G06F 3/041
USPC ....................................................... 345/173
See application file for complete search history.

(56) References Cited

U.S. PATENT DOCUMENTS

| | | | |
|---|---|---|---|
| 8,174,628 B2 | 5/2012 | Matsushita et al. | |
| 2005/0040962 A1* | 2/2005 | Funkhouser | G06F 1/1601 340/815.4 |
| 2010/0134873 A1 | 6/2010 | van Lieshout et al. | |
| 2010/0164888 A1 | 7/2010 | Okumura et al. | |
| 2011/0096476 A1 | 4/2011 | Choi | |

(Continued)

FOREIGN PATENT DOCUMENTS

| | | |
|---|---|---|
| CN | 1816268 A | 8/2006 |
| CN | 101171621 A | 4/2008 |

(Continued)

OTHER PUBLICATIONS

Chinese examination report dated Jan. 22, 2019 from the China Patent Office in respect of the China Patent Application.

*Primary Examiner* — Long D Pham
(74) *Attorney, Agent, or Firm* — Kile Park Reed & Houtteman PLLC

(57) ABSTRACT

A flexible display apparatus includes a flexible display, a housing to store at least a portion of the flexible display, and a first guide in the housing to guide movement of the flexible display, and to sense a squeezing motion on the housing.

10 Claims, 10 Drawing Sheets

(56) References Cited

U.S. PATENT DOCUMENTS

| | | |
|---|---|---|
| 2012/0019482 A1 | 1/2012 | Wang |
| 2012/0314400 A1 | 12/2012 | Bohn et al. |
| 2013/0083496 A1 | 4/2013 | Franklin et al. |
| 2013/0201208 A1 | 8/2013 | Cho et al. |
| 2013/0335311 A1 | 12/2013 | Kim |
| 2014/0101560 A1 | 4/2014 | Kwak et al. |
| 2014/0160010 A1 | 6/2014 | Jung et al. |
| 2014/0166992 A1 | 6/2014 | Hack et al. |
| 2014/0198016 A1 | 7/2014 | Hunt et al. |
| 2014/0204037 A1 | 7/2014 | Kim |
| 2014/0362512 A1* | 12/2014 | Hinson ............... G06F 15/025 361/679.21 |
| 2016/0120022 A1* | 4/2016 | Lee .................. G06F 1/1652 361/749 |

FOREIGN PATENT DOCUMENTS

| | | |
|---|---|---|
| CN | 101681075 A | 3/2010 |
| CN | 101782804 A | 7/2010 |
| CN | 103827771 A | 5/2014 |
| EP | 1970886 A1 | 9/2008 |
| KR | 10-2007-0097007 A | 10/2007 |
| KR | 10-2010-0027502 A | 3/2010 |
| KR | 10-2010-0035475 A | 4/2010 |
| KR | 10-2010-0038528 A | 4/2010 |
| KR | 10-2011-0133861 A | 12/2011 |
| KR | 10-2014-0017391 A | 2/2014 |
| KR | 10-2014-0062280 A | 5/2014 |
| KR | 10-2014-0075409 A | 6/2014 |
| KR | 10-2014-0094333 A | 7/2014 |
| KR | 10-2014-0095347 A | 8/2014 |
| WO | WO 2014/030947 A1 | 2/2014 |

\* cited by examiner

FLEXIBLE DISPLAY APPARATUS HAVING A ROTATION GUIDE

CROSS-REFERENCE TO RELATED APPLICATIONS

This is a continuation application based on pending application Ser. No. 14/811,980, filed Jul. 29, 2015, the entire contents of which is hereby incorporated by reference.

Korean Patent Application No. 10-2015-0006145, filed on Jan. 13, 2015, in the Korean Intellectual Property Office, and entitled: "Flexible Display Apparatus," is incorporated by reference herein in its entirety.

BACKGROUND

1. Field

The present disclosure herein relates to a flexible display apparatus in which a flexible display is installed.

2. Description of the Related Art

When users use electronic devices, mobility is an important issue. In particular, various, e.g., mobile, electronic apparatuses, in addition to mobile phones, having performance equivalent to desktop computers have recently been sold. As such electronic apparatuses become small-sized and lightweight, various electronic information is now available to users even while on the move.

In particular, as flexible display panels have been widely used recently, displays of such electronic apparatuses may be expanded. Thus, structures and control methods for flexible display apparatuses according to the expansion of the displays are in demand to provide convenience to users.

SUMMARY

The present disclosure provides a flexible display apparatus including a guide unit for guiding movement of a flexible display and simultaneously sensing pressure against a housing unit.

Embodiments provide a flexible display apparatus, including a flexible display, a housing unit to store at least a portion of the flexible display, and a first guide unit in the housing unit to guide movement of the flexible display, the first guide unit sensing a squeezing motion on the housing unit.

The first guide may include a rotating unit to rotate according to the movement of the flexible display, and a fixed unit defining a rotation axis of the rotating unit.

The rotating unit may sense the movement of the flexible display, and the fixed unit may sense the squeeze motion on the housing.

The fixed unit may be an electrostatic capacitive sensor or a piezoelectric sensor.

The fixed unit may be the electrostatic capacitive sensor and may include a first electrode and a second electrode facing the first electrode, the fixed unit senses the squeezing motion by using a change in electrostatic capacitance between the first electrode and second electrode according to an external force on the housing.

The fixed unit may be the piezoelectric sensor and may include a first electrode, a second electrode facing the first electrode, and a piezoelectric element between the first and second electrodes, the fixed unit senses the squeezing motion by using an electrical potential difference generated in the piezoelectric element according to an external force on the housing.

The rotating unit may be a torque sensor or a gyro sensor.

The rotating unit may include an elastic cover of an elastic material, and a rotation guide to guide the elastic cover to rotate based on the fixed unit serving as an axis of rotation.

The first guide may be at a first side of the housing and senses the squeezing motion on the first side of the housing.

The flexible display apparatus may further include first and second panels in parallel to each other, the first guide being between the first and second panels, wherein one end of each of the first and second panels is adjacent to the first guide, and the first and second panels extend from the first side of the housing to a second side opposite the first side.

The first and second sides of the housing, respectively, may correspond to uppermost and lowermost sides or to leftmost and rightmost sides of the housing.

When the first guide is pressed, a distance between the first and second panels may decrease by the squeezing motion on the housing, and the first guide may sense the squeezing motion by sensing the degree of pressure.

The flexible display apparatus may further include a second guide at a second side of the housing opposite the first side of the housing, the second guide sensing a squeezing motion on the second side.

The squeezing motion may be pressure that exceeds a predetermined force applied to the housing.

The flexible display may be slidable or rollable into or out od the housing.

The first guide may guide the flexible display into or out of the housing.

The first guide may guide the path along which the flexible display is rolled into or out of the housing.

The flexible display apparatus may further include a controller to control the first guide and the flexible display.

The controller may detect at least one of the moving direction, moving speed, and moving distance of the flexible display by using the rotating unit of the first guide, and may detect a region of the flexible display exposed to the outside based on the detected results.

The controller may detect the region exposed to the outside to selectively activate the region exposed to the outside.

The controller may detect the squeezing motion on the housing via the fixed unit of the first guide, and may control display of a region exposed to the outside of the flexible display based on the detected results.

The controller may navigate menus provided by a menu interface corresponding to the movement of the flexible display when an image being displayed is a menu interface, and may select or execute one menu from the menus according to the navigated result when detecting the squeezing motion.

The housing may further include a transparent cover of a transparent material.

The housing may support a region of the flexible display exposed to an outside.

A specific region of the housing corresponding to the first guide may include an elastic material.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1A:
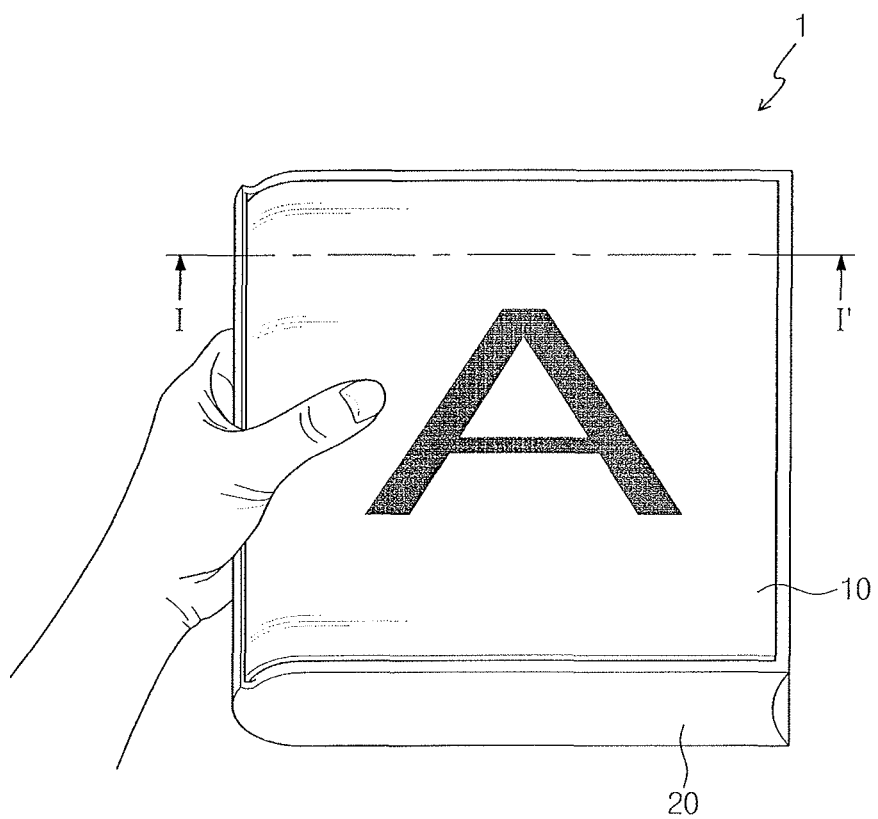
FIGS. 1A to 1C illustrate front perspective views of a flexible display apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

The teams used herein are selected from general terms widely used if possible in consideration of the functions herein. However, these may be changed according to the intent of a person of ordinary skill in the art, practice or the advent of new technologies. Also, in specific cases, there may be terms selected by the applicants, in which case, the meaning will be described in the detailed description of the corresponding embodiment. Thus, the terms used in the specification should not be understood simply as the names thereof, but should be understood based on actual meanings that are not the terms, and the entire contents of the specification.

According to the development of display device technology installed in electronic apparatuses, flexible displays are being commercialized. In the specification, an electronic apparatus installed with a flexible display is referred to as a flexible display apparatus. The flexible display apparatus has a meaning including various electronic apparatuses with portability, e.g., electronic apparatuses such as mobile phones, personal digital assistants (PDA), notebook computers, tablet PCs, MP3 players, CD players, DVD players, wearable devices, head mount displays (HMDs), and smart watches.

Figure 1B:
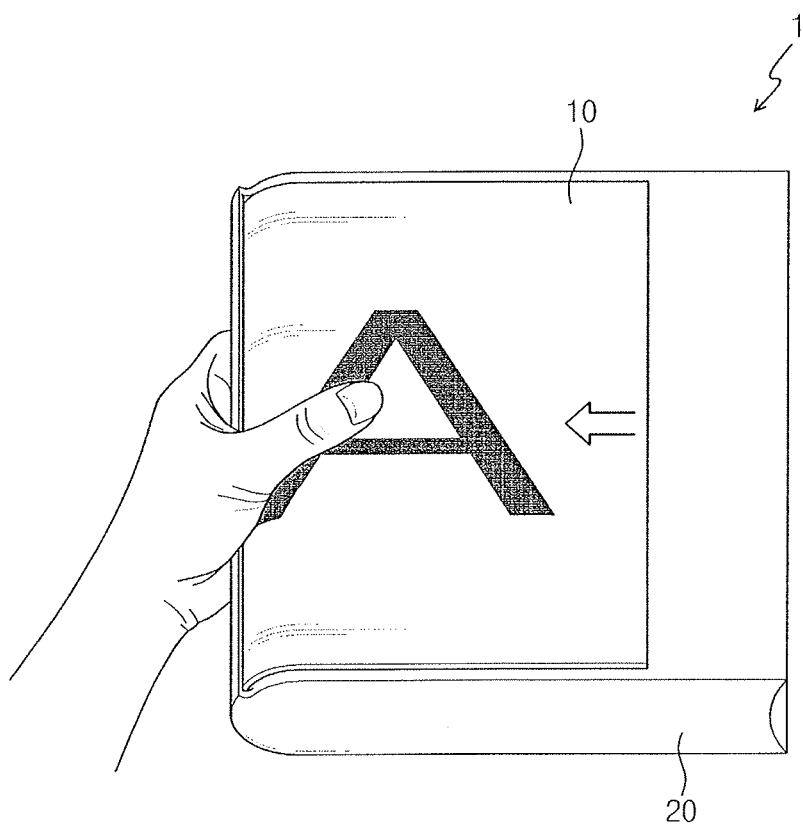
Figure 1C:
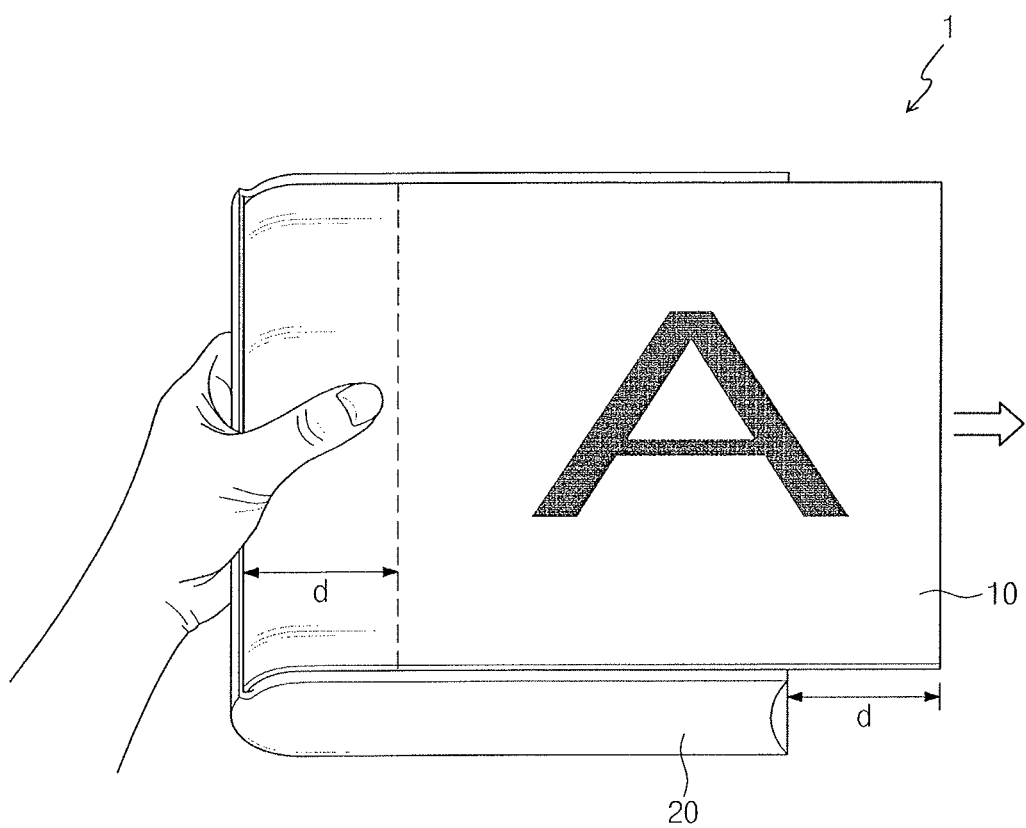

FIGS. 1A to 1C illustrate front perspective views of a flexible display apparatus according to an embodiment.

Referring to FIGS. 1A to 1C, a flexible display apparatus 1 may generally include a flexible display 10, and a housing unit 20 storing the flexible display 10. The flexible display 10 designates a flexible display which may be bent, folded, rolled, etc. without a loss in display characteristics, e.g., unlike traditional hard display panels. The flexible display 10 is characterized in that it is lighter in weight, thinner, has higher impact resistance, and may be freely bent when compared to traditional hard displays. The flexible display 10 may include at least one of, e.g., liquid crystal displays, thin film transistor-liquid crystal displays, organic light-emitting diode (OLED) displays, 3D displays, and transparent OLED (TOLED) displays.

A substrate of the flexible display 10 may be formed of, e.g., a metal foil, very thin glass, or a plastic substrate. In particular, in the case of the plastic substrate, a PC substrate, a PET substrate, a PES substrate, a PI substrate, a PEN substrate, and/or an AryLite substrate may be used.

Furthermore, in the specification, the flexible display 10 may designate a plurality of separated displays. Accordingly, a plurality of hard displays may be designated as the flexible display 10.

The housing unit 20 may store at least a portion of the flexible display 10. Here, the housing unit 20 may store the flexible display 10 by various methods. For example, the housing unit 20 may store the flexible display 10 through a method such as roll-in, slide-in, bent-in, and fold-in. In particular, in the specification, the housing unit 20 may store the flexible display 10 through the roll-in or slide-in methods, and a detailed description thereof will be given below with reference to FIGS. 2A and 2B.

Users may use the flexible display 10 by moving it out from the housing unit 20 or moving it into the housing unit 20, when necessary. For example, as illustrated in FIG. 1B, when wanting to use a small screen, users may move the flexible display 10 into the housing unit 20. Otherwise, as illustrated in FIG. 1C, when wanting to use a large screen, users may move the flexible display 10 out from the housing unit 20.

That is, users may adjust the available displaying area by moving the flexible display 10 into or out from the housing unit 20 according to the objects of use. The housing unit 20 may further include a guide unit for guiding the flexible display 10 to move into or move out from the housing unit 20, and a detailed description thereof will be given below with reference to FIGS. 2A and 2B.

The housing unit 20 may function to support a display region of the flexible display 10 exposed to the outside. In view of the characteristics of the flexible display 10, when there is no support member, a user may have inconvenience in using the flexible display 10. For example, since the flexible display 10 has a high degree of freedom in terms of shape, users may experience difficulty in stably touching the flexible display 10 or securing a view of the bent region of the flexible display 10.

Accordingly, the housing unit 20 supports the display region exposed to the outside, so that the flexible display 10 may be stably used by a user. Furthermore, the housing unit 20 prevents damage to the display due to excessive shape deformation thereof by supporting the flexible display 10.

However, the apparatus is not limited to the above-mentioned embodiment, and the flexible display apparatus 1 may separately include a support unit (not shown) for supporting the flexible display 10. Here, the support unit may function to stably support the exposed region of the flexible display 10 while moving together with the flexible display 10. The support unit may be configured in a frame-shape or a panel shape supporting the flexible display 10.

Furthermore, although not shown in the drawings, the housing unit 20 may include various units for driving the flexible display apparatus 1. For example, the housing unit 20 may include a power supply unit for supplying power to the flexible display apparatus 1, an audio input/output unit for inputting/outputting audio, and a control unit for controlling the component units of the flexible display apparatus 1. In particular, the control unit performs functions to detect an input to the flexible display apparatus 1, and controls the flexible display 10 based on the detected results, and a detailed description thereof will be given below with reference to FIG. 5.

Figure 2A:
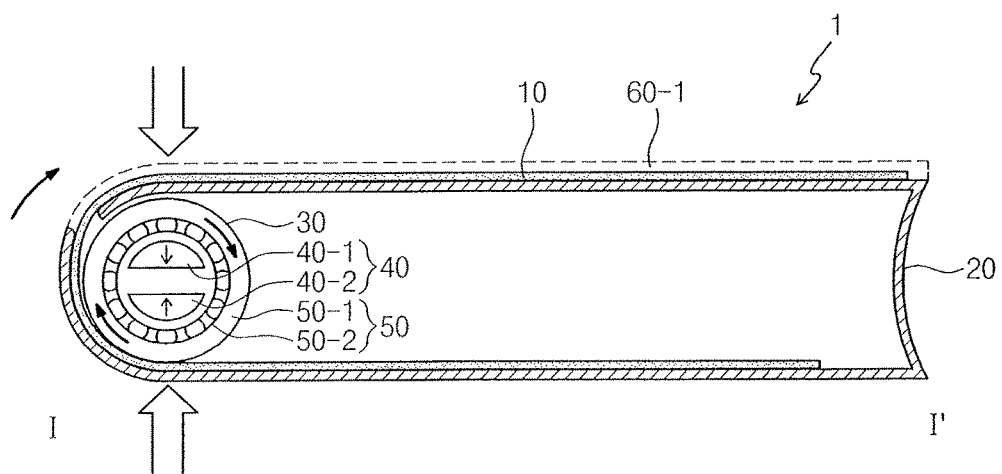
FIGS. 2A and 2B illustrate cross-sectional views taken along line I-I' of the flexible display apparatus illustrated in FIG. 1A.
Figure 2B:
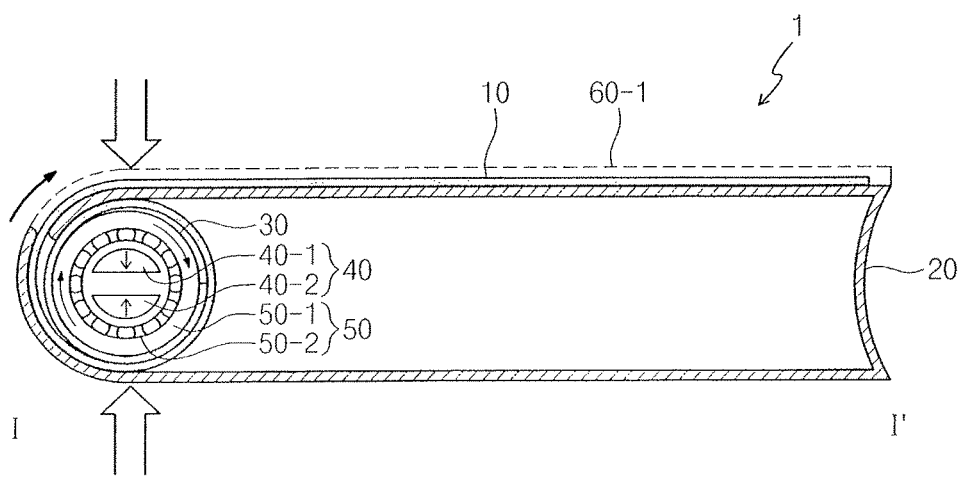

FIGS. 2A and 2B illustrate cross-sectional views taken along line I-I' of the flexible display apparatus illustrated in FIG. 1A.

Referring to FIGS. 2A and 2B, the housing unit 20 may store at least a portion of the flexible display 10, and may include a first guide unit 30 for guiding the movement of the stored flexible display 10. A specific region of the housing unit 20 corresponding to the position of the first guide unit 30 may be formed of an elastic material. This is for the purpose of allowing an external pressure on the housing unit 20 to be transferred to the first guide unit 30. The housing unit 20 may selectively include a transparent cover unit 60-1 of a transparent material for protecting the flexible display region exposed to the outside. The first guide unit 30 guides the flexible display 10 moving into or out from the housing, so that users may be assisted in stably moving the flexible display 10. For this purpose, the first guide unit 30 may include a rotating unit 50 and a fixed unit 40.

The rotating unit 50 may guide the movement of the flexible display 10. The rotating unit 50 may contact at least a portion of the flexible display 10 and rotate according to the movement of the flexible display 10 through friction force. Thus, the rotating unit 50 switches the moving direction of the flexible display 10, and at the same time, allows the flexible display 10 to smoothly move.

Also, the rotating unit 50 may sense the movement of the flexible display 10 through sensing the rotation thereof. More specifically, the rotating unit 50 may sense the moving direction, the moving distance, the moving speed, etc. of the flexible display 10 by using the number of revolutions, the rotation angle, the rotation speed, etc. thereof. Here, the rotating unit 50 may be a torque sensor, or a gyro sensor. A torque sensor refers to various sensing methods and or devices for measuring the torque of an object, and a gyro sensor refers to various sensing methods or devices for measuring the amount of angle change of an object. In addition, the rotating unit 50 may be any one of various sensing methods and devices and is not limited to the above embodiments.

The rotating unit 50 may include an elastic cover unit 50-1 formed of an elastic material, and a rotation guide unit 50-2 guiding the elastic cover unit 50-1 to rotate about the fixed unit 40 serving as an axis. The rotation guide unit 50-2 is disposed between the elastic cover unit 50-1 and the fixed unit 40, and guides the elastic cover unit 50-1 to smoothly rotate about the fixed unit 40 serving as an axis. The rotation guide unit 50-2 may also be formed of an elastic material.

The fixed unit 40 represents a fixed part regardless of the movement of the flexible display 10. Also, the fixed unit 40 may perform the function of a rotation axis of the rotating unit 50. Accordingly, the fixed unit 40 may be located at the center of the rotating unit 50.

The fixed unit 40 may sense a squeezing motion pressing the housing unit 20 by a force not less than a predetermined force (along arrows in FIGS. 2A-2B). For example, the fixed unit 40 may sense a user's motion for gripping or grasping the housing unit 20 with a force not less than a predetermined force as the squeezing motion. As another example, the fixed unit 40 may sense a user's motion for touching or pressing the housing unit 20 with a force more than a predetermined force as the squeezing motion. That is, the fixed unit 40 of the specification may sense the user's various motions pressing the housing unit 20 by a force more than a predetermined force by using a part of his or her body (e.g. hands, fingers, etc.) or a tool (e.g. stylus pens, etc.), as the squeezing motion, but is not limited the above-mentioned embodiments.

Since the housing 20 and the rotating unit 50 include elastic materials, the external pressure may be transferred to the fixed unit 40 through the housing unit 20 and the rotating unit 50. As such, the fixed unit 40 senses the squeezing motion by sensing the transferred external pressure.

For example, the fixed unit 40 may be an electrostatic capacitive sensor. In this case, the fixed unit 40 may include first and second electrodes 40-1 and 40-2 facing each other. Also, according to embodiments, the fixed unit 40 may further include an elastic cover which is formed of an elastic material, and which covers the first and second electrodes 40-1 and 40-2. When an external pressure is applied to the housing unit 20 by the squeezing motion of a user, the housing unit 20, the rotating unit 50, and fixed unit 40 may be elastically deformed. Through the elastic deformation of the fixed unit 40, the distance between the first and second electrodes 40-1 and 40-2 may be changed inside the fixed unit 40, resulting in a change in the electrostatic capacity between the first and second electrodes 40-1 and 40-2. The fixed unit 40 may sense a squeezing motion by sensing the change in the electrostatic capacity.

In another example, the fixed unit 40 may be a piezoelectric sensor. In this case, the fixed unit 40 may include first and second electrodes 40-1 and 40-2, and a piezoelectric element between the first and second electrodes 40-1 and 40-2. Here, the piezoelectric element may represent an element generating an electrical potential difference by a physical external pressure. Also, the fixed unit 40 may further include an elastic cover which is formed of an elastic material, and which covers the first and second electrodes 40-1 and 40-2. When an external pressure is applied to the housing unit 20 by the squeezing motion of a user, the housing unit 20, the rotating unit 50, and fixed unit 40 may be elastically deformed. Through the elastic deformation of the fixed unit 40, pressure may be applied to the piezoelectric element, and as a result, an electrical potential difference is generated in the piezoelectric element. The fixed unit 40 may sense a squeezing motion through sensing the electrical potential difference generated in piezoelectric element.

In addition, the rotating unit 40 may be implemented as various sensing method or devices, and is not limited to the above embodiments.

When considering the above, the flexible display apparatus 1 of the specification utilizes the first guide unit 30 guiding the movement of the flexible display 10 as a rotation sensor or a squeeze sensor for each region, so that there may be advantageous effects in terms of miniaturization, manufacturing process, and costs of the flexible display apparatus 1. Also, the flexible display apparatus 1 as described herein controls the display according to a user's squeezing motion, so that a more intuitive display control method may be provided. Hereinafter, for convenience of description, the rotating unit 50 and the fixed unit 40 will be described while being identified with the first guide unit 30.

The flexible display 10 may be stored in the housing unit 20 by a various methods. Examples will be described below with reference to FIGS. 2A-2B.

For example, referring to FIG. 2A, the flexible display 10 may be stored in the housing unit 20 by a slide-in method. The slide-in method represents a method in which the flexible display 10 is stored in an unfolded state inside the housing unit 20. In detail, the first guide unit 30 may guide the slide-in or slide-out path, e.g., movement, of the flexible display 10. For example, as illustrated in FIG. 2A, the flexible display 10 may extend along an external surface of the housing unit 20, and may continuously extend into the housing unit 20 along an internal surface of the housing unit, so rotation of the first guide unit 30 moves an unfolded flexible display 10 along surfaces of the housing unit 20. Users may adjust the exposed region of the flexible display by sliding in or sliding out the flexible display 10.

In another example, referring to FIG. 2B, the flexible display 10 may be stored in the housing unit 20 by a roll-in method. The roll-in method represents a method in which the flexible display 10 is stored in a rolled state inside the housing unit 20. In this case, the flexible display 10 may be rolled on, e.g., around, the guide unit 30 in a roll-shape. The first guide unit 30 may guide the path along which the flexible display 10 is to be rolled into or rolled out of. For example, as illustrated in FIG. 2B, the flexible display 10 may extend along an external surface of the housing unit 20, and may continuously extend into the housing unit 20 to be rolled around the first guide unit 30, so rotation of the first guide unit 30 rolls or unrolls the flexible display 10. Users may adjust the exposed region of the flexible display by rolling in or rolling out the flexible display 10.

In addition, the flexible display 10 may be stored in the housing unit 20 by various methods, e.g., a bend-in method, a fold-in method, etc. Hereinafter, for convenience, descriptions of the flexible display apparatus 1 stored in the housing unit 20 will be given with respect to the slide-in method. However, the following description can be applied not only to the flexible display apparatus 1 of slide-in method, but may be applied to all the flexible display apparatuses 1 including the flexible display 10 according to embodiments.

Figure 3:
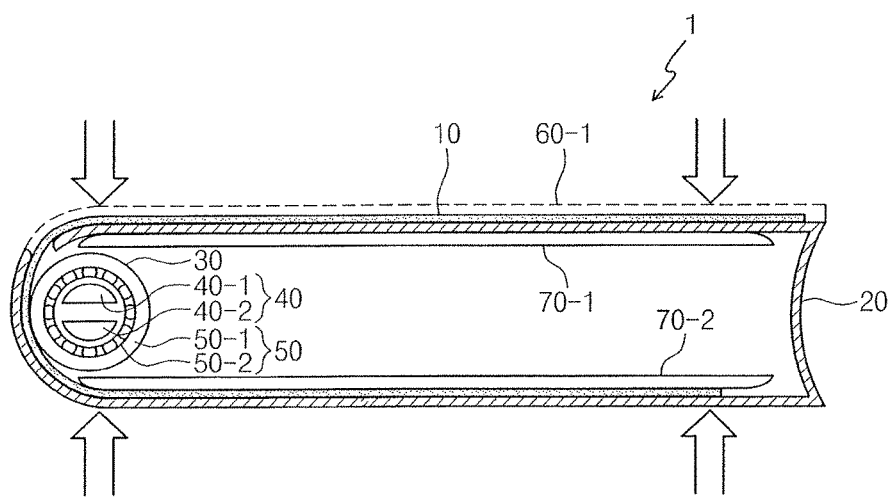
FIG. 3 illustrates a cross-sectional view of a flexible display apparatus including a plurality of panels.

FIG. 3 illustrates a cross-sectional view of a flexible display apparatus including a plurality of panels.

Referring to FIG. 3, the flexible display apparatus 1 may include first and second panels 70-1 and 70-2 to sense the squeezing motion in various regions of the housing unit 20. The first and second panels 70-1 and 70-2 may be formed of rigid materials, e.g., metal, glass, and plastic.

The first and second panels 70-1 and 70-2 may be disposed parallel to each other with the first guide unit 30 disposed therebetween. For example, the first and second panels 70-1 and 70-2 may be respectively disposed in upper and lower sides of the first guide unit 30. One end of each of the first and second panels 70-1 and 70-2 may be disposed adjacent to the first guide unit 30. Accordingly, a vacant space corresponding to the width of the first guide unit 30 may exist between the first and second panels 70-1 and 70-2.

When the first guide unit 30 is provided at a first side of the housing unit 20, the first and second panels 70-1 and 70-2 may extend from the first side to a second side. The second side may represent a side parallel to the first side. For example, the first and second sides may respectively correspond to uppermost and lowermost sides or to leftmost and rightmost sides of the housing unit.

Through the squeezing motion on, e.g., either one of, the first and second sides of the housing unit 20, a distance between the first and second panels 70-1 and 70-2 may decrease. For example, if the first side is pressed, the first guide unit 30 disposed between the first and second panels 70-1 and 70-2 may be pressed, and the first guide unit 30 may sense the squeezing motion applied thereon by sensing the degree of pressure applied thereon. In another example, if the second side is pressed, the flexible display apparatus 1 may sense the squeezing motion on the second side in which the first guide unit 30 is not disposed, e.g., via the rigid first and second panels 70-1 and 70-2 extending from the second side to the first guide unit 30.

For example, the first and second panels 70-1 and 70-2 may be integrally disposed with the housing unit 20. In another example, the first and second panels 70-1 and 70-2 may be separately disposed and fixed to the housing unit 20. In addition, the first and second panels 70-1 and 70-2 may be disposed in the housing unit 20 in various embodiments, and are not limited to the above-mentioned embodiments. In this way, the flexible display apparatus 1 as described herein may include at least one panel as auxiliary means for sensing the squeezing motion on various regions of the housing unit 20

Figure 4:
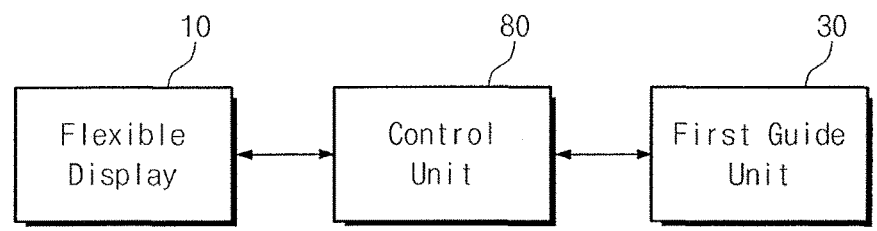
FIG. 4 illustrates a schematic block diagram of the flexible display apparatus of FIGS. 1A to 3.

FIG. 4 illustrate a schematic block diagram of the flexible display apparatus 1 of FIGS. 1A to 3.

Referring to FIG. 4, the flexible display apparatus 1 may include the flexible display 10, the first guide unit 30 guiding the movement of the flexible display 10, and a control unit controlling the flexible display 10 and the first guide unit 30.

The flexible display 10 may display images. The flexible display 10 may gradually display images in correspondence with expansion/contraction of the length or the area thereof according to flexible characteristics. The flexible display 10 may display images corresponding to an exposed region. Here, the images may represent still images, video images, texts, or other various images which include these images and can be visually expressed in various ways. The flexible display 10 may display the images based on contents executed by the control unit 80 and control commands of the control unit 80.

The first guide unit 30 may guide the movement of the flexible display 10 as described above with reference to FIGS. 2A and 2B. Furthermore, the first guide unit 30 may sense the movement of the flexible display 10 and the squeezing motion on the housing unit 20. The first guide unit 30 may transmit the sensing results to the control unit 80.

The control unit 80 may execute various applications by processing internal data of the flexible display apparatus 1. Also, the control unit 80 may control the applications being executed in the flexible display apparatus 1 based on the detected commands. The control unit 80 may control each above-mentioned unit, and also control the receipt/transmission between the units. In particular, the control unit 80 as described herein may detect various environments related to the flexible display apparatus 1 by using the guide unit 30, and control each unit based on the detecting results.

When the control unit 80 receives a sensing result related to the movement of the flexible display 10 from the first guide unit 30, i.e., when the control unit 80 detects movement of the flexible display 10, the control unit 80 may detect the moving direction, the moving speed, the moving distance, etc. of the flexible display 10. In accordance with the detected moving speed, direction, distance, etc., the control unit 80 may selectively activate an exposed region of the flexible display 10, i.e., activate a region of the flexible display 10 exposed to the outside in correspondence with the detecting results. For example, the control unit 80 may selectively supply a power source or electrical power to a specific region of the flexible display 10, i.e., the exposed region, according to the detecting results to display images.

When the control unit 80 receives a sensing result related to the squeezing motion from the first guide unit 30, i.e., when the control unit 80 detects a squeezing motion, the control unit 80 may detect the user's squeezing motion on the flexible display apparatus 1. The control unit 80 may execute various control commands for controlling the display of the exposed area of the flexible display 10. For example, when detecting the squeezing motion, the control unit 80 may display application execution image corresponding to the selected icon. Various embodiments regarding the control commands corresponding to squeezing motions will be described below in detail with reference to FIGS. 5 to 6C.

Hereinafter, it may be described that the control unit 80, according to user input, controls the flexible display apparatus 1 or at least one unit included in the flexible display apparatus 1. The control unit 80 and the flexible display apparatus 1 may be explained while being identified with each other.

FIG. 4 illustrate a block diagram according to an embodiment of the flexible display apparatus 1, and separately illustrated blocks are illustrated by logically separating the components of the apparatus. Accordingly, the above-mentioned units may be mounted as one chip or a plurality of chips according to the design of the apparatus.

Figure 5:
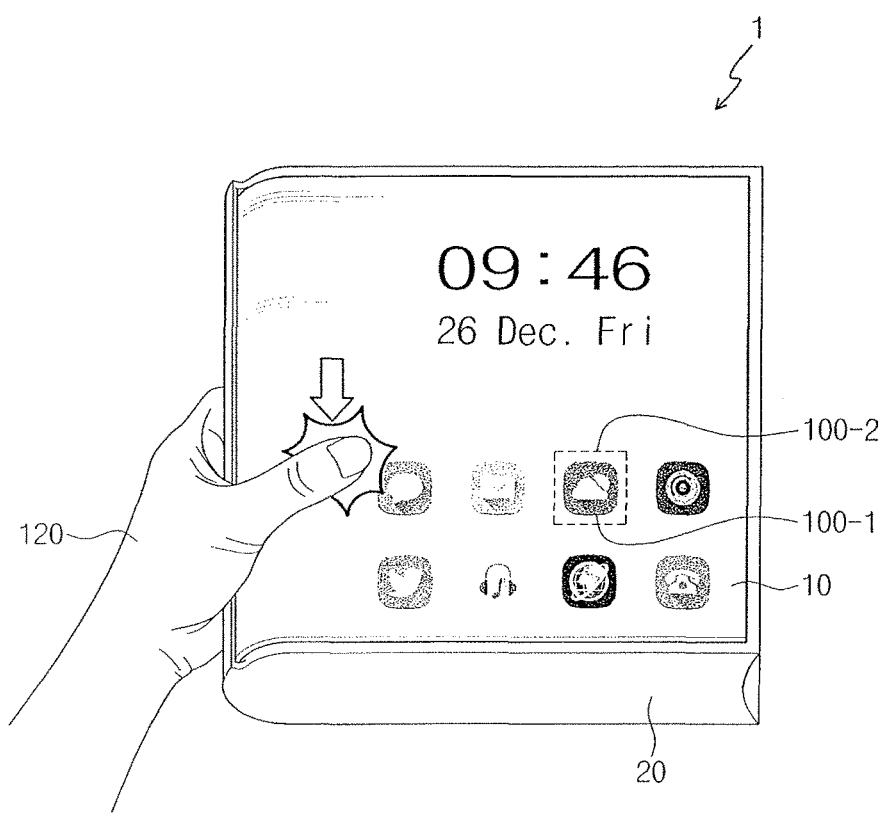
FIG. 5 illustrates a view of an embodiment of a flexible display apparatus performing a selection or execution operation corresponding to a squeeze motion.

FIG. 5 illustrates a view of an embodiment of the flexible display apparatus 1 performing a selection or execution operation corresponding to a squeeze motion. Referring to FIG. 5, the flexible display apparatus 1 may perform various operations corresponding to squeezing motions.

For example, the flexible display apparatus 1 may perform a selection or execution of one object among a plurality of objects corresponding to a squeezing motion 120. For example, the flexible display apparatus 1 may perform a selection or an execution of a first icon 100-1 from among a plurality of icons. Here, the flexible display apparatus 1 may display an indicator 100-2 indicating the selected icon or the icon or to be executed.

When a user is going to select or execute the first icon 100-1, which the indicator 100-2 indicates, the corresponding first icon 100-1 may be selected or executed by simply squeezing the flexible display apparatus 1. The icon 100-1 which the indicator 100-2 indicates may be separately designated by a touch input or the like of a user.

In another example, the flexible display apparatus 1 may perform a preset control command corresponding to the squeezing motion 120. The preset control command may be determined with respect to the application currently being executed. For example, when a squeezing motion is detected while playing music, the flexible display apparatus 1 may pause the music being played in response to the squeezing motion 120. Here, when the flexible display apparatus 1 further detects a squeezing motion 120, the paused music may be replayed.

In addition, the flexible display apparatus 1 may perform various control operations. For example, operation such as "rewind," "cancel execution," "switch page," "scroll," etc., with respect to an application being executed, may be performed in in response to the squeezing motion 120, which is not limited to the above-mentioned embodiments.

In general, users use the flexible display apparatus 1 by gripping one side of the flexible display apparatus 1 by one hand. The flexible display apparatus 1, as described herein, allows users to easily control the corresponding apparatus by hand gripping the apparatus, so that a more convenient and easier method for controlling the flexible display apparatus 1 may be provided.

Figure 6A:
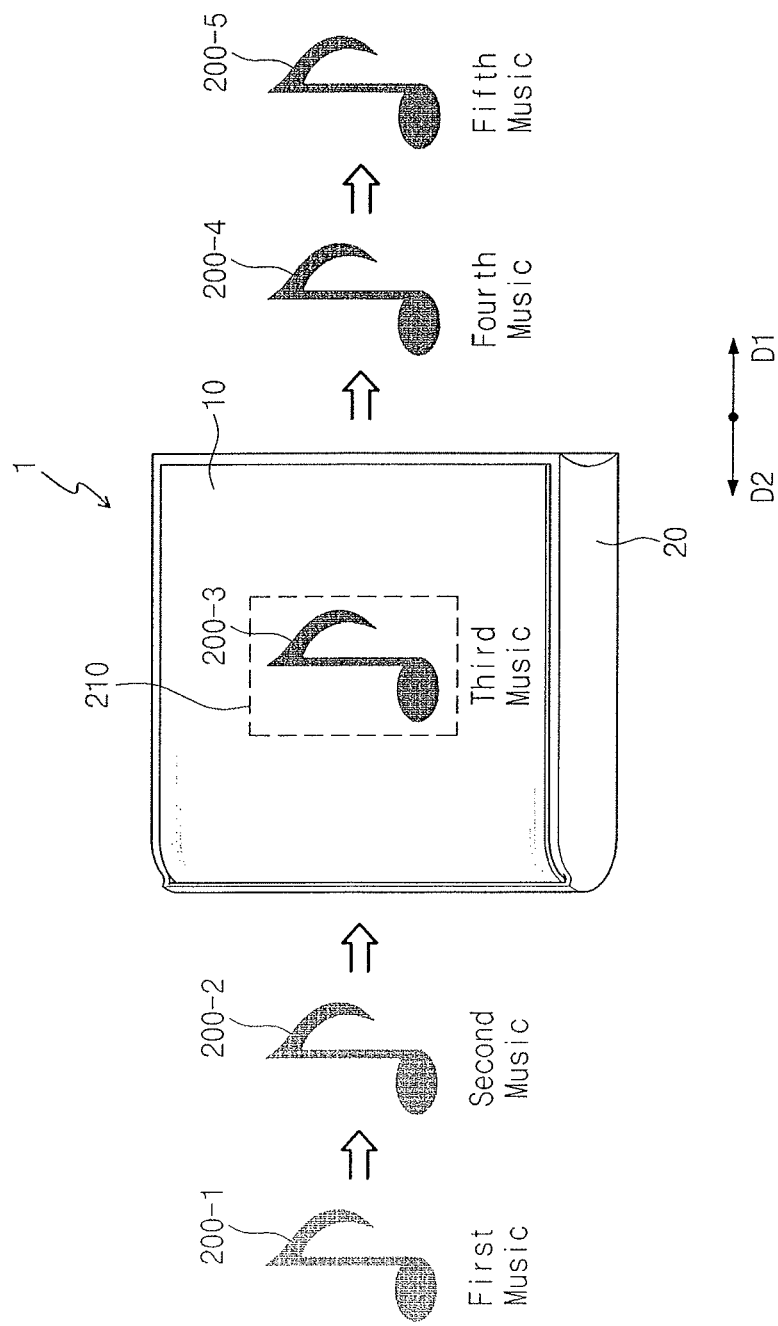
FIGS. 6A to 6C illustrate views of an embodiment of a flexible display apparatus performing various operations corresponding to inward or outward movement of the flexible display apparatus and a squeeze motion.
Figure 6B:
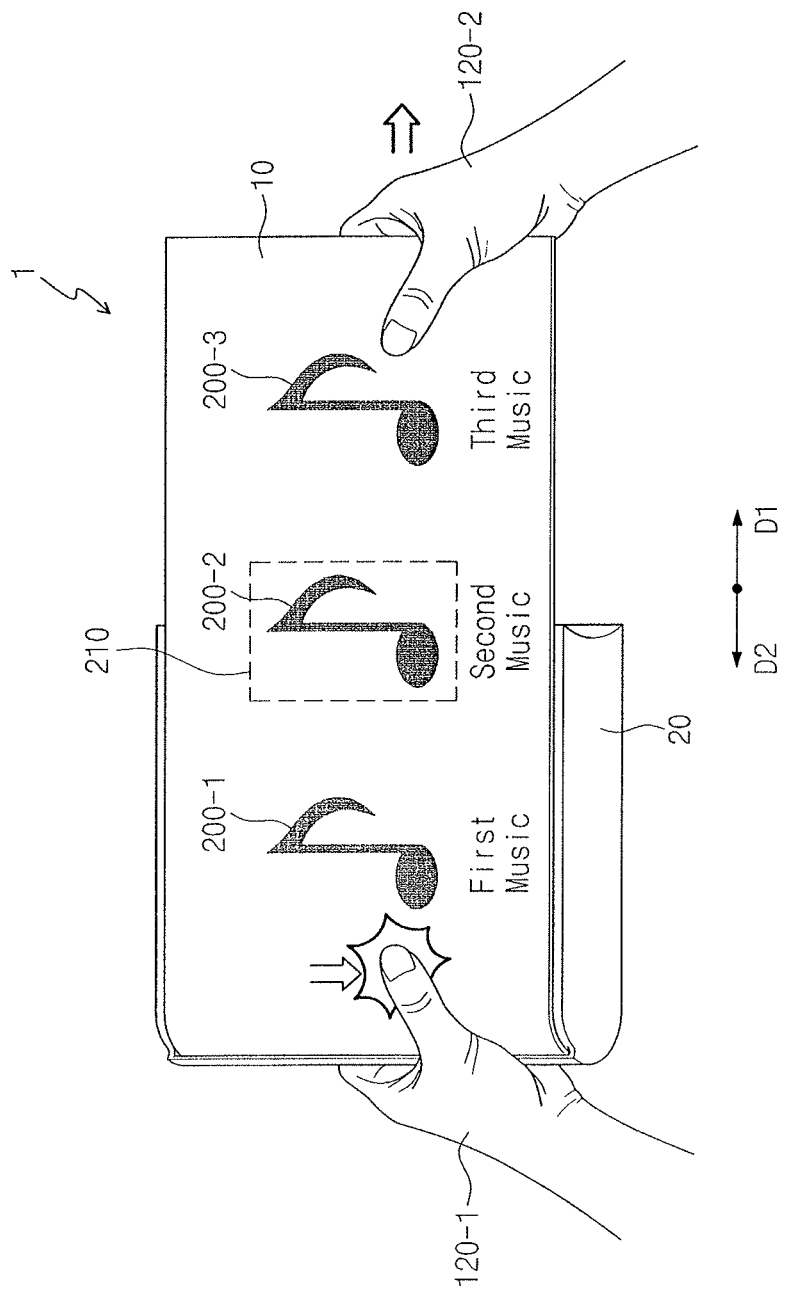
Figure 6C:
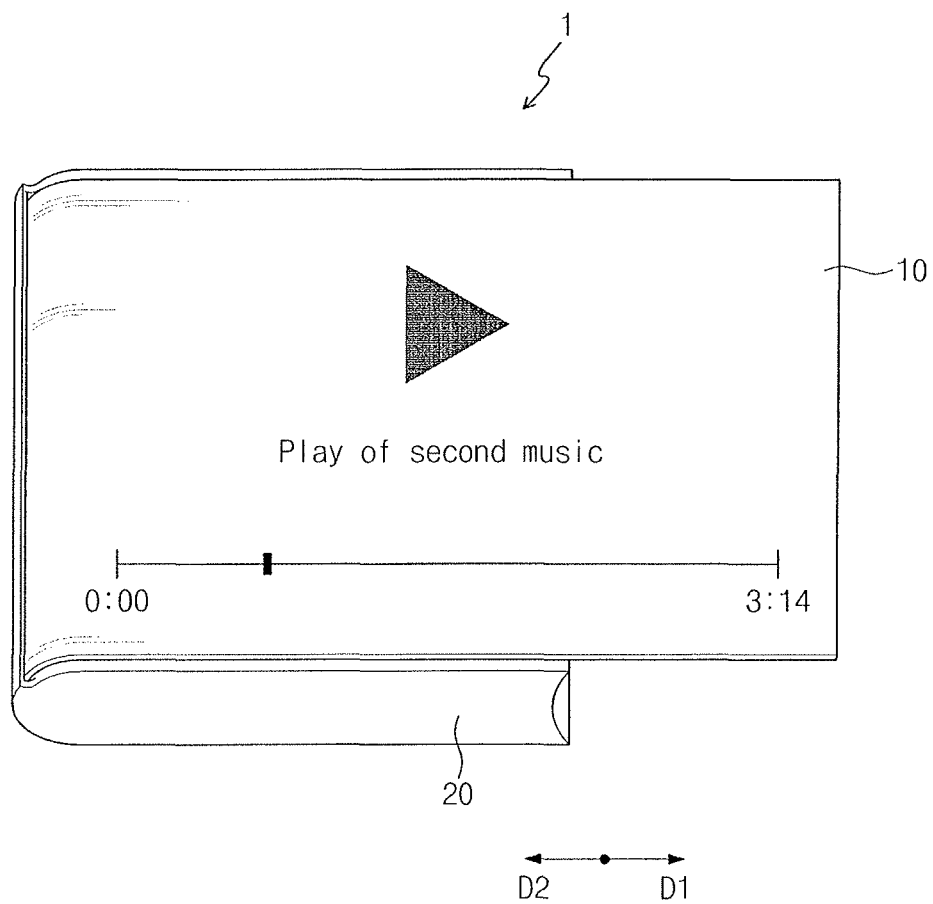

FIGS. 6A to 6C illustrate views of an embodiment of the flexible display apparatus 1 performing various operations corresponding to an inward movement or an outward movement of the flexible display apparatus and a squeeze motion.

For example, referring to FIGS. 6A-6C, the flexible display apparatus 1 may provide a menu interface with a plurality of menus. Here, the flexible display apparatus 1 may navigate the plurality of menus in accordance with the movement of the flexible display 10. Users may navigate the plurality of menus provided by the menu interface, and select or execute at least one menu.

For example, referring to FIGS. 6A to 6C, the flexible display apparatus 1 may provide a music menu interface with a plurality of playable music menus 200-1, 200-2, 200-3, 200-4 and 200-5. The plurality of music menus 200-1, 200-2, 200-3, 200-4 and 200-5 may be arranged in a predetermined sequence and direction. For example, the music menus 200-1, 200-2, 200-3, 200-4 and 200-5 may be arranged in a first direction D1, and in a sequence of a first music 200-1→a second music 200-2→a third music 200-3→a fourth music 200-4→a fifth music 200-5. The music menus 200-1, 200-2, 200-3, 200-4 and 200-5 may be navigated in correspondence with the movement of the flexible display 10.

For example, referring to FIG. 6B, when a user outwardly pulls the flexible display 10 (operation 120-2) in the first direction D1 while providing the third music menu 200-3, the flexible display 10 may navigate the music menus 200-1, 200-2, 200-3, 200-4 and 200-5 arranged in the second direction D2 opposite the first direction D1. As a result of navigating the music menus 200-1, 200-2, 200-3, 200-4 and 200-5 in the second direction D2, the first and second music menus 200-1 and 200-2 sequentially arranged in the second direction D2 may be additionally or sequentially displayed on an expanded region of the flexible display 10.

In another example, when a user inwardly moves the flexible display 10 in the second direction D2 while providing the third music menu 200-3, the flexible display 10 may navigate the music menus 200-4 and 200-5 arranged in the first direction D1. As a result of navigating the music menus 200-4 and 200-5 in the first direction D1, the fourth and fifth music menus 200-4 and 200-5 sequentially arranged in the first direction D1 may be additionally or sequentially displayed on a exposed region of the flexible display 10.

At least one among the navigated music menus 200-1, 200-2, 200-3, 200-4 and 200-5 may be executed by a squeezing motion 120-1 of a user.

When the navigated menus 200-1 and 200-2 are added according to a movement of the flexible display 10, the flexible display 10 may provide an indicator 210, i.e., similar to the indicator 100-2 described above with reference to FIG. 5. Accordingly, a user may execute a menu 200-2 to execute among the plurality of navigated menus 200-1 and 200-2 by performing the squeezing motion 120-1 when the indicator 210 indicates the menu 200-2. For example, when a user wants to execute the second menu 200-2, the second menu 200-2 may be executed by performing the squeezing motion 120-1 while the indicator 210 indicates the second menu 200-2.

When the navigated menus are sequentially provided one by one according to a movement of the flexible display 10, a user may execute a corresponding menu by performing the squeezing motion 120-1 when the menu the user wants to execute is provided. For example, when a user wants to execute the second menu 200-2, the second menu 200-2 may be executed by performing the squeezing motion 120-1 when the second menu 200-2 is displayed on the flexible display 10.

However the indicator 210 of the current embodiment may move together with the flexible display 10, which is different from that of FIG. 5. For example, when the flexible display 10 moves in the first direction D1 while the indicator 210 indicates the third menu 200-3, the indicator 210 may move in the second direction and indicate the second menu 200-2.

Thus, the flexible display apparatus 1 as described herein provides a simple control method correlated to the movement of the flexible display 10 and the squeezing motion. Therefore, users may more easily and conveniently control the apparatus.

Figure 7A:
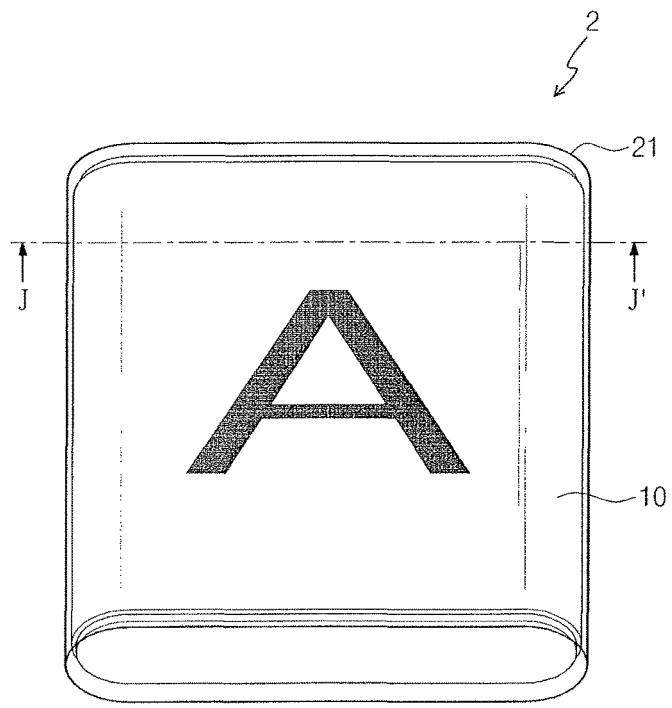
FIG. 7A illustrates a front perspective view of a flexible display apparatus including a plurality of guide units.
Figure 7B:
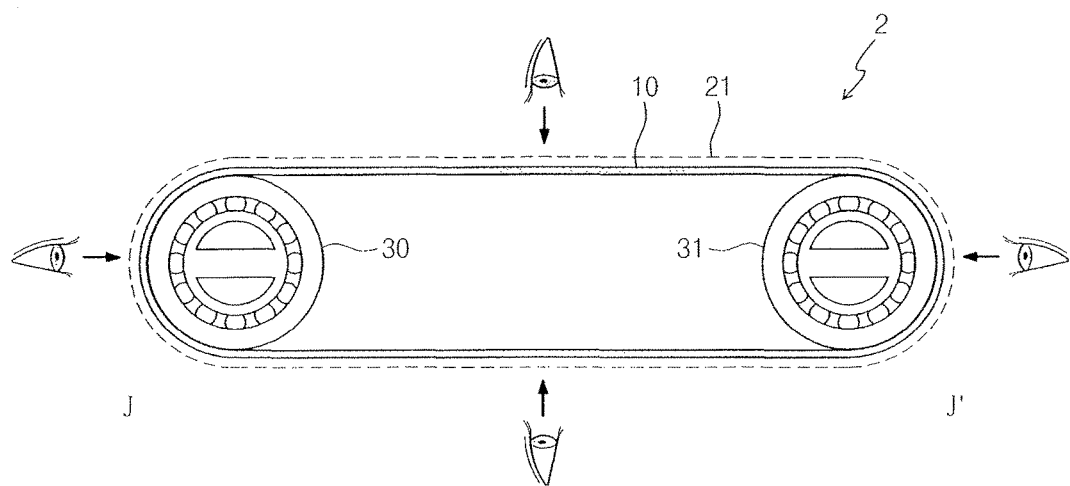
FIG. 7B illustrates a cross-sectional view line J-J' of the flexible display apparatus illustrated in FIG. 7A.

FIG. 7A illustrates a front perspective view of a flexible display apparatus including a plurality of guide units. FIG. 7B is a cross-sectional views taken along line J-J' of the flexible display apparatus illustrated in FIG. 7A.

Referring to FIGS. 7A to 7B, a flexible display apparatus 2 may include a plurality of guide units in a housing unit 21. For example, the flexible display apparatus 2 may include first and second guide units 30 and 31. Here, the second guide unit 31 is substantially the same as the first guide unit 30 mentioned above.

However, the flexible display 10 of the current embodiment may be supported not by the housing unit 20 but by the first and second guide units 30 and 31, which is different from the above-mentioned embodiments. Here, first and second ends of the flexible display 10 may be connected to each other, and thus the first and second guide units 30 and 31 may be located in an inner space thus defined.

Also, the housing unit 21 of the flexible display apparatus 2 of the current embodiment may be formed of a transparent material and disposed to cover an entire region of the flexible display 10. Since the housing unit 21 is formed of a transparent material, the view of the entire region of the flexible display 10 may be secured regardless of whether the flexible display 10 outwardly moves form the housing unit 21.

The first and second guide units 30 and 31 may be respectively disposed in the first side and the second side parallel to the first side of the housing unit 21. For example, the first and second guide units 30 and 31 may be respectively disposed in upper and lower sides or in left and right sides.

The first and second guide units 30 and 31 may sense a squeezing motion as well as guide a rotation of the flexible display 10 in the housing unit 21. When the flexible display 10 rotates inside the housing unit 21, the first and second guide units 30 and 31 may rotate in a same direction to each other.

Since the first and second guide units 30 and 31 are respectively disposed in the first and second sides, a squeezing motion on the first and second sides may be sensed. In order to sense squeezing motions on entire regions of the flexible display 10, the first and second panels 70-1 and 70-2 of FIG. 3 may be further disposed adjacent to the first and second guide units 30 and 31.

According to an embodiment, a guide unit guiding movement of a flexible display, e.g., sliding or rolling out of a housing unit, also senses gripping pressure, e.g., of a user. As such, input of a user into the flexible display may be sensed through the gripping pressure without using additional separate components. Thus, there is an advantage in terms of miniaturization and manufacturing costs of the flexible display. Also, according to another embodiment, various control methods for a flexible display apparatus may be provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A flexible display apparatus, including:
    a flexible display to provide images on one side of the flexible display;
    a housing to store at least a portion of the flexible display;
    an elastic cover disposed inside the housing and contacting another side of the flexible display, the another side facing the one side;
    a fixed unit including a first electrode and a second electrode facing the first electrode, the fixed unit being disposed inside the elastic cover; and
    a rotation guide disposed between the fixed unit and the elastic cover and guiding rotation of the elastic cover.

2. The flexible display apparatus as claimed in claim 1, wherein a distance between the first electrode and the second electrode is changed by an external pressure.

3. The flexible display apparatus as claimed in claim 2, wherein when the distance between the first electrode and the second electrode is changed, the flexible display apparatus determines that a pressure is applied from the outside.

4. The flexible display apparatus as claimed in claim 2, wherein when the flexible display is drawn out from the housing, the fixed unit is fixed, and the elastic cover rotates with respect to the fixed unit.

5. The flexible display apparatus as claimed in claim 2, the flexible display apparatus further including:
    a first panel disposed on one side of the inside of the housing; and
    a second panel disposed on another side of the inside of the housing and facing the first panel.

6. The flexible display apparatus as claimed in claim 5, wherein the first panel and the second panel are integral with the housing.

7. The flexible display apparatus as claimed in claim 5, wherein at least a portion of the flexible display is disposed between the housing and the second panel.

8. The flexible display apparatus as claimed in claim 2, wherein an outer surface of the housing supports a portion of the flexible display that is drawn out from the housing.

9. The flexible display apparatus as claimed in claim 2, wherein the housing further includes a transparent cover covering a portion of the flexible display exposed to the outside.

10. The flexible display apparatus as claimed in claim 1, wherein the housing transmits pressure applied from outside to the fixed unit.

* * * * *